United States Patent [19]

Ohta et al.

[11] Patent Number: 4,523,963
[45] Date of Patent: Jun. 18, 1985

[54] METHOD OF FABRICATING MOS DEVICE ON A SOS WAFER BY STABILIZING INTERFACE REGION WITH SILICON AND OXYGEN IMPLANT

[75] Inventors: Takao Ohta, Tokyo; Junichi Ohno, Yokohama, both of Japan

[73] Assignee: Tokyo Shibaura Denki Kabushiki Kaisha, Kawasaki, Japan

[21] Appl. No.: 583,833

[22] Filed: Feb. 27, 1984

[30] Foreign Application Priority Data

Mar. 2, 1983 [JP] Japan ................................. 58-34174

[51] Int. Cl.³ .................... H01L 21/265; H01L 7/00
[52] U.S. Cl. .................................. 148/1.5; 29/571; 29/576 B; 29/576 T; 148/187; 357/23.7; 357/91
[58] Field of Search ................... 148/1.5, 187; 29/571, 29/576 B, 576 T; 357/91, 23

[56] References Cited

U.S. PATENT DOCUMENTS

| | | | |
|---|---|---|---|
| 3,909,307 | 8/1975 | Stein | 148/1.5 |
| 4,177,084 | 12/1979 | Lau et al. | 148/1.5 |
| 4,178,191 | 12/1979 | Flatley | 148/1.5 |
| 4,385,937 | 5/1983 | Ohmura | 148/1.5 |
| 4,437,225 | 3/1984 | Mizutani | 29/576 B |

OTHER PUBLICATIONS

Lau et al., Appl. Phys. Letts., 34 (1979) 76.
Maeyama et al., Jap. Jour. Appl. Phys., 21 (1982) 744.
Feldman et al., Phys. Rev. Letts., 41 (1978) 1396.
Ohmura et al., Jour. Appl. Phys., 54 (Nov. 1983) 6779.
Yamamoto et al., "Gettering Effect by Oxygen Implantation in SOS," Appl. Phys. Lett., vol. 34, No. 6, Mar. 15, 1979.
Yoshii, et al., "Improvement of SOS Device Performance by Solid-Phase Expitaxy," Proceedings of the 13th Conference on Solid State Devices, Tokyo, 1981; Japanese Journal of Applied Physics, vol. 21 (1982) Supplement 21-1, pp. 175-179.

Primary Examiner—Upendra Roy
Attorney, Agent, or Firm—Finnegan, Henderson, Farabow, Garrett and Dunner

[57] ABSTRACT

A method for manufacturing a semiconductor device, comprising the steps of forming a monocrystalline silicon layer on a sapphire substrate, ion-implanting silicon and oxygen in a portion of the silicon layer which is in the vicinity of an interface between the substrate and the silicon layer, performing annealing to improve a crystal structure of the portion of the silicon layer in the vicinity of the interface and forming an insulation layer, selectively forming an element isolation region in the silicon layer to obtain an island silicon layer, forming a gate insulation film on the island silicon layer, forming a gate electrode on the gate insulation film, ion-implanting an impurity in the island silicon layer by using the gate electrode as a mask, and annealing a resultant structure to form source and drain regions in the island silicon layer such that bottoms thereof reach a surface of the insulation layer.

1 Claim, 21 Drawing Figures

METHOD OF FABRICATING MOS DEVICE ON A SOS WAFER BY STABILIZING INTERFACE REGION WITH SILICON AND OXYGEN IMPLANT

BACKGROUND OF THE INVENTION

The present invention relates to a method for fabricating a MOS device on a SOS wafer by stabilizing the interface region with silicon and oxygen implantation.

Conventionally, a semiconductor device, e.g., an n-channel MOS transistor on an SOS wafer, is manufactured as follows.

Figure 1A:
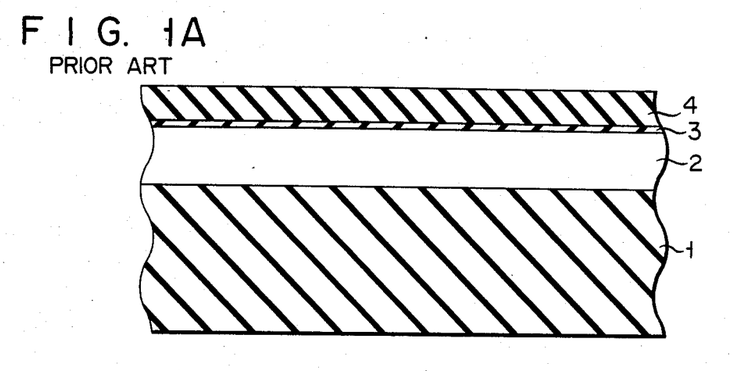
FIGS. 1A to 1H are sectional views for explaining the steps of manufacturing an n-channel MOS transistor in accordance with a conventional method.

As shown in FIG. 1A, a monocrystalline silicon layer 2 is formed by the epitaxial growth on a sapphire substrate 1 to a thickness of 0.6 μm to prepare an SOS wafer. The silicon layer 2 was thermally oxidized, thus forming an $SiO_2$ film (i.e., buffer film) 3 which is 500 Å thick. CVD (chemical vapor deposition) was then carried out, thus forming on the $SiO_2$ film 3 an $Si_3N_4$ film 4 which is 4500 Å thick.

Figure 1B:
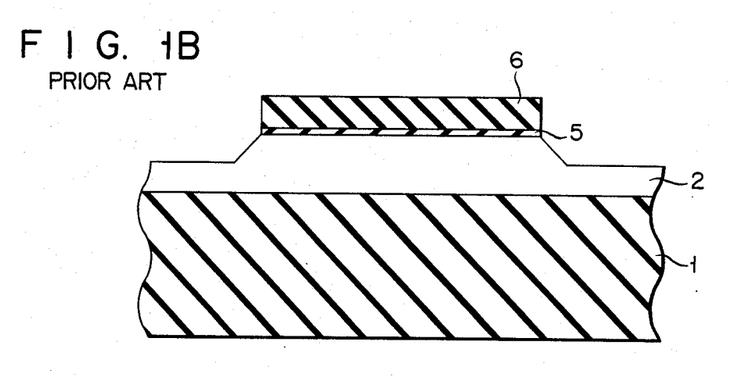

As shown in FIG. 1B, a resist pattern (not shown), having an opening corresponding to a prospective element isolation region, is formed by the photoengraving process (PEP) on the $Si_3N_4$ film 4. The $Si_3N_4$ film 4 and the $SiO_2$ film 3 are sequentially etched by the reactive ion etching method (RIE method) using the resist pattern as a mask to form an $SiO_2$ pattern 5 and an $Si_3N_4$ pattern 6. The resist pattern is removed, and the resultant structure is selectively etched by an etching solution of potassium hydroxide and isopropyl alcohol using as masks the $SiO_2$ pattern 5 and the $Si_3N_4$ pattern 6, so an exposed portion of the silicon layer 2 is etched to a depth of 0.3 μm.

Figure 1C:
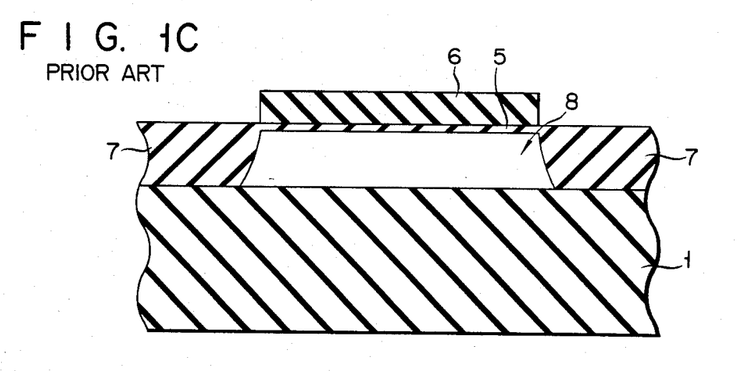

As shown in FIG. 1C, the resultant structure is annealed in an atmosphere of a gas mixture of $H_2$ and $O_2$ at a temperature of 950° C. for 6 hours to form a field oxide film (element isolation region) 7 having substantially the same level as that of the silicon layer 2. Therefore, an island silicon layer 8 (element region), isolated by the field oxide film 7, is formed.

Figure 1D:
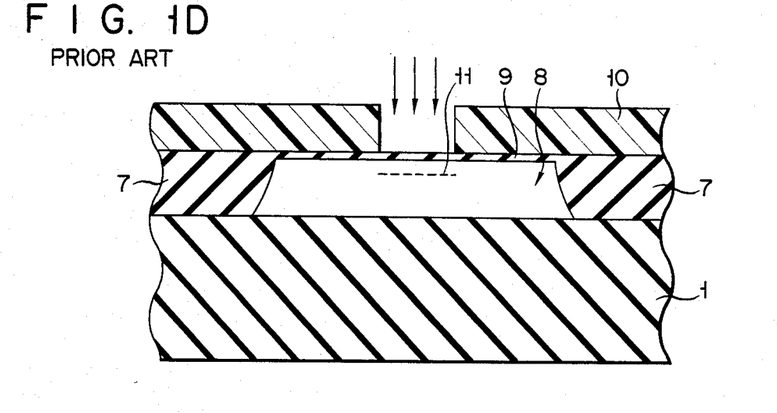

As shown in FIG. 1D, after the $Si_3N_4$ pattern 6 and the $SiO_2$ pattern 5 are removed, the resultant structure is thermally oxidized to form a gate oxide film 9 on the island silicon layer 8 to a thickness of 450 Å. After a resist pattern 10 having an opening corresponding to the prospective channel region is formed by PEP, a p-type impurity, e.g., boron, is ion-implanted in the island silicon layer 8 through the gate oxide film 9 at an acceleration energy of 160 keV and a dose of $3 \times 10^{12}$ cm$^{-2}$ using the resist pattern 10 as a mask, thereby forming a boron ion injection layer 11.

Figure 1E:
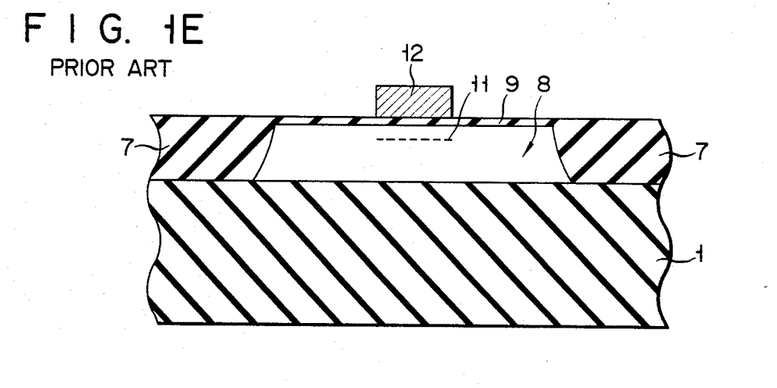

After the resist pattern 10 is removed, an impurity, e.g., phosphorus, doped polycrystalline (polysilicon) film is deposited by the CVD method to cover the entire surface to a thickness of 4,500 Å. The polysilicon film is patterned to form a gate electrode 12, as shown in FIG. 1E.

Figure 1F:
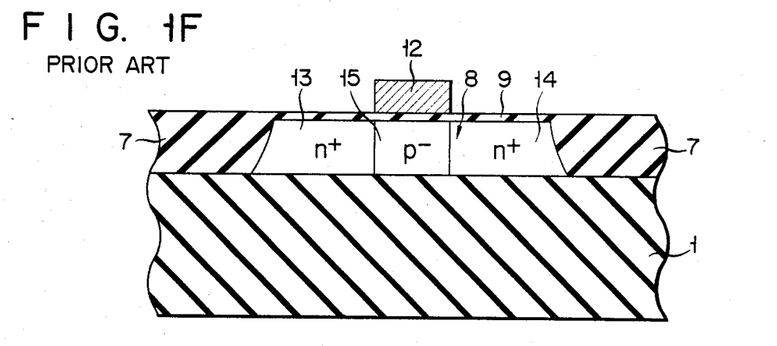

As shown in FIG. 1F, an n-type impurity, e.g., arsenic, is ion-implanted in the island silicon layer 8 through the gate oxide film 9 at an acceleration energy of 40 keV and a dose of $2 \times 10^{15}$ cm$^{-2}$, using as masks the field oxide film 7 and the gate electrode 12. The resultant structure is then annealed to form n$^+$-type source and drain regions 13 and 14 in the silicon layer 8, so as to reach the surface of the sapphire substrate 1. In this case, the boron ion injection layer 11 is activated, so boron is diffused to form a p$^-$-type channel region 15 in the silicon layer 8 between the source and drain regions 13 and 14.

Figure 1G:
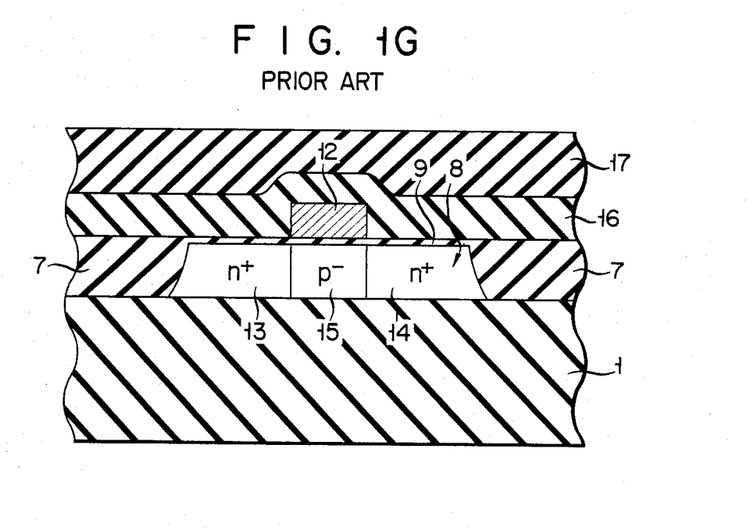
Figure 1H:
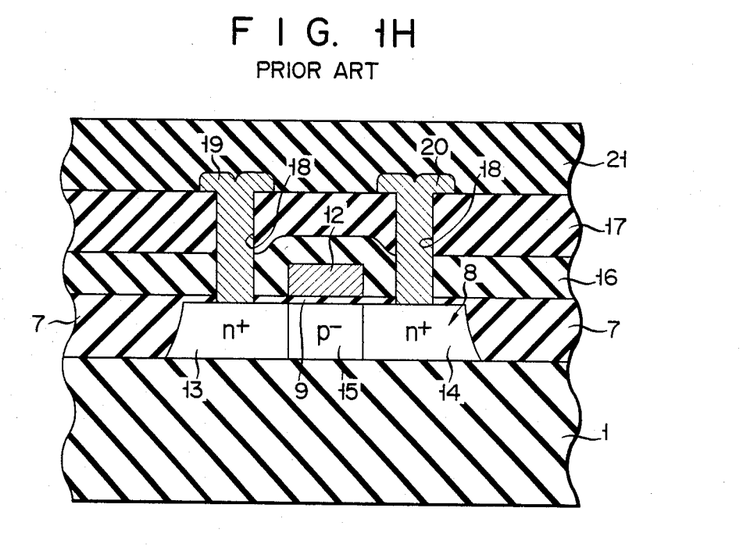

As shown in FIG. 1G, an $SiO_2$ film 16 and a boron-phosphorus-silicate-glass (BPSG) film 17 are sequentially formed by the CVD method. As shown in FIG. 1H, the BPSG film 17, the $SiO_2$ film 16, and the gate oxide film 9 are selectively etched using a resist film (not shown) as a mask to form contact holes 18. Thereafter, the resist pattern is removed. An aluminum film is then deposited to cover the entire surface and is patterned to form aluminum wiring strips 19 and 20, which are respectively connected to the source and drain regions 13 and 14 through the corresponding contact holes 18. A phosphorus-silicate-glass (PSG) film 21 is deposited by the CVD method to cover the entire surface to a thickness of 1.2 μm. Thus, an n-channel MOS transistor is prepared.

However, according to this conventional method, a crystal defect occurs at an interface between the sapphire substrate 1 and the silicon layer 2 (island silicon layer 8). For this reason, the conductivity type of a portion of the island silicon layer 8, which is located near the interface, is inverted, with the result that a current flows across the source and drain regions 13 and 14, which is called a back channel phenomenon. In addition, a large surface state occurs between the substrate 1 and island silicon layer 8. This surface state varies, inevitably varying the threshold voltage of the prepared transistor. In addition to these disadvantages, carrier mobility is lowered, which impairs high-speed operation of the MOS transistor. The crystal defect arises due to the following four reasons.

(1) Mismatching

The (100) plane of the monocrystalline silicon layer 2 grows on the (1̄102) plane of the sapphire substrate 1. Mismatching of about 12.5% of the crystal structues of sapphire and monocrystalline silicon occurs due to a difference between the crystal structures thereof.

(2) Influence of Sapphire Substrate

The silicon layer 2 is grown by epitaxial growth on the sapphire substrate 1 in an atmosphere of silane gas ($SiH_4$), so that the following by-product reactions occur:

$$2Si + Al_2O_3 \rightarrow Al_2O + 2SiO$$

$$2H_2 + Al_2O_3 \rightarrow Al_2O + 2H_2O$$

The main reaction is interfered with by the above by-product reactions.

(3) Stress

A thermal expansion coefficient of the sapphire substrate 1 is about twice that of the monocrystalline silicon layer 2. When the SOS wafer is abruptly cooled from a high-temperature state, the sapphire substrate 1 urges the silicon layer 2, thereby producing a stress. As a result, a crystal defect occurs in the silicon layer 2.

(4) Auto-doping of Aluminum

When the monocrystalline silicon layer 2 is epitaxially grown on the sapphire substrate 1, aluminum is automatically doped in the silicon layer 2 at a dose of $10^{21}$ to $10^{22}$ atoms/cm$^{-3}$ (Trilhe J. et al., 4th Int. Conf. "Vapor Growth & Epitaxy", NAGOYA, PP. 65-66, 1977).

Figure 2:
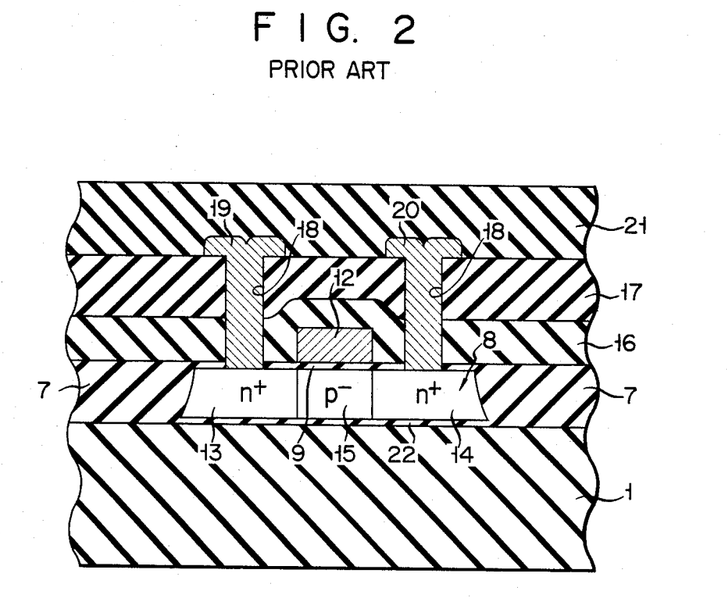
FIG. 2 is a sectional view showing an n-channel MOS transistor manufactured by conventional methods.

In consideration of these reasons, another method of manufacturing an n-channel MOS transistor, shown in FIG. 2, has been recently proposed wherein a monocrystalline silicon layer is epitaxially grown on a sapphire substrate 1, oxygen is ion-implanted in the vicinity of the interface of the substrate 1 and the silicon layer at an acceleration energy of 150 keV and a dose of $1.2 \times 10^{16}$ cm$^{-2}$. The resultant structure is annealed at a temperature of 1,150° C. for 2 hours to prepare an SOS wafer, and the n-channel MOS transistor is prepared in the same manner as shown in FIGS. 1A to 1H. According to this method, a drain leakage current can be decreased to some extent, but aluminum oxide produced by the by-product reaction in item (2) cannot be effectively removed.

Still another conventional method is described in "Denshi Zairyo (Electronic Materials)", P. 115, January, 1981. According to this method, before silicon is epitaxially grown on sapphire, silicon and oxygen are ion-implanted in a sapphire substrate at a low acceleration energy and a dose of $1 \times 10^{13}$ cm$^{-2}$ to $5 \times 10^{13}$ cm$^{-2}$. Thereafter, silicon is epitaxially grown by the plasma CVD method at a low temperature of 800° C. The content of aluminum in the monocrystalline silicon layer is decreased to 15% and 0.2% by ion implantation of silicon and oxygen, respectively. At the same time, electron mobility can be recovered to 65% and 75% of the bulk value by the ion implantation of silicon and oxygen, respectively. According to this method, although the content of aluminum can be decreased, the surface crystal structure is disturbed by the ion implantation. When the silicon layer is epitaxially grown on the sapphire substrate, mismatching of item (1) and stress of item (3) are increased. As a result, an inconvenient leak in the current increases.

Still another conventional method is proposed, wherein boron is ion-implanted in the island silicon layer to control the threshold voltage of the resultant transistor, and boron is also ion-implanted such that a peak of the impurity concentration occurs at the interface between the sapphire substrate and the island silicon layer. However, since the silicon layer becomes thin along with micropatterning of the element, it is very difficult to simultaneously control the impurity profiles in the vicinity of the surface of the silicon layer and at its interface with the sapphire substrate.

SUMMARY OF THE INVENTION

It is an object of the present invention to provide a method for manufacturing a semiconductor device with high reliability wherein leakage current is decreased.

It is another object of the present invention to provide a method for manufacturing semiconductor devices at a high yield by improving variations in threshold voltage.

It is still another object of the present invention to provide a method of manufacturing a high-speed semiconductor device by improving electron or hole mobility in a semiconductor layer on an insulation substrate.

In order to achieve the above and other objects of the present invention, there is provided a method of fabricating a MOS device on a SOS wafer by stabilizing an interface region with a silicon and oxygen implant, comprising the steps of:

forming a monocrystalline silicon layer on a sapphire substrate;

ion-implanting silicon and oxygen in a portion of said silicon layer, which is located in the vicinity of the interface between said sapphire substrate and said silicon layer;

annealing the resultant structure to improve a crystal structure of said portion of said silicon layer in the vicinity of said interface, and forming an insulation layer at said interface;

selectively forming an element isolation region in said silicon layer to obtain an island silicon layer;

forming a gate insulation film on said island silicon layer;

forming a gate electrode on said gate insulation film;

ion-implanting an impurity in said island silicon layer by using said gate electrode as a mask; and annealing the resultant layer to form source and drain regions in said island silicon layer such that bottoms thereof reach a surface of said insulation layer.

DETAILED DESCRIPTION OF THE PREFERRED EMBODIMENT

An example will be described with reference to FIGS. 3A to 3J wherein the present invention is applied to the manufacture of an n-channel MOS transistor.

Figure 3A:
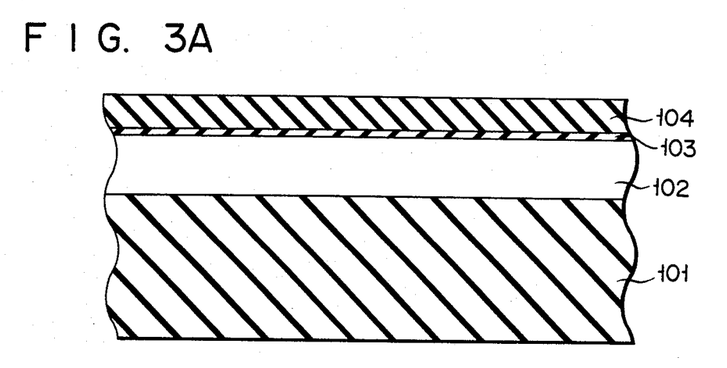
FIGS. 3A to 3J are sectional views for explaining the steps of manufacturing an n-channel MOS transistor according to an embodiment of the present invention.
Figure 3B:
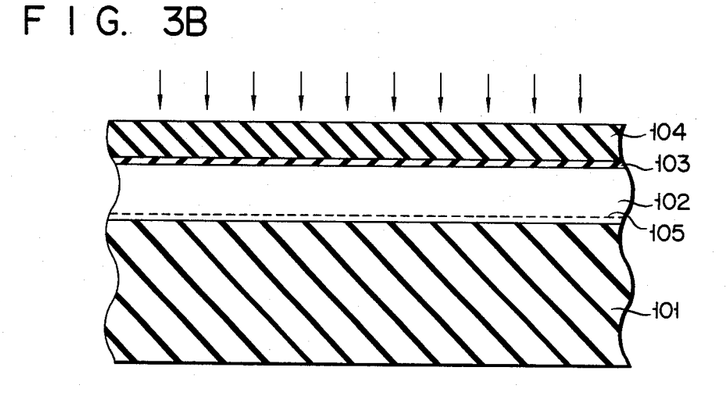

As shown in FIG. 3A, a monocrystalline silicon layer 102, having the (100) plane and a thickness of 0.6 μm, was epitaxially grown by thermal decomposition of silane (SiH$_4$) on a sapphire substrate ($\alpha$-Al$_2$O$_3$) 101, having the ($1\bar{1}02$) plane and a thickness of 625 μm. The silicon layer 102 was thermally oxidized, thus forming an SiO$_2$ film (i.e., buffer film) 103 which is 500 Å thick. CVD (chemical vapor deposition) was then carried out, thus forming on the SiO$_2$ film 103 an Si$_3$N$_4$ film which is 4500 Å thick. Thereafter, as shown in FIG. 3B, silicon was ion-implanted at an acceleration energy of 100 keV and a dose of $2 \times 10^{15}$ cm$^{-2}$, and oxygen was then ion-implanted at an acceleration energy of 100 keV and a dose of $2 \times 10^{15}$ cm$^{-2}$ to form an impurity ion-injection layer 105 having a concentration peak at a portion of the silicon layer 102 located in the vicinity of the interface between the substrate 101 and the silicon layer 102.

Figure 3C:
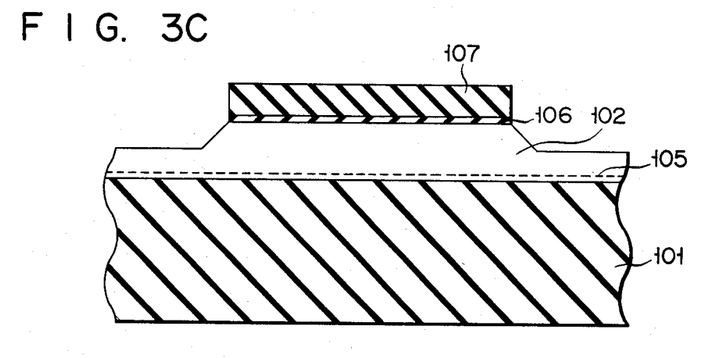

As shown in FIG. 3C, a resist pattern (not shown), having an opening corresponding to the prospective element isolation region, was formed by PEP on the Si$_3$N$_4$ film 104, and the Si$_3$N$_4$ film 104 and the SiO$_2$ film 103 were sequentially etched by the RIE method using the resist pattern as a mask, thereby forming an SiO$_2$ pattern 106 and an Si$_3$N$_4$ pattern 107 in the order named when viewed from the surface of the silicon layer 102. After the resist pattern was removed, an exposed portion of the silicon layer 102 was etched by isotropic etching using an etching solution of potassium hydroxide and isopropyl alcohol and using as masks the patterns 106 and 107, so that the silicon layer 102 was selectively etched to a thickness of about 0.3 μm.

Figure 3D:
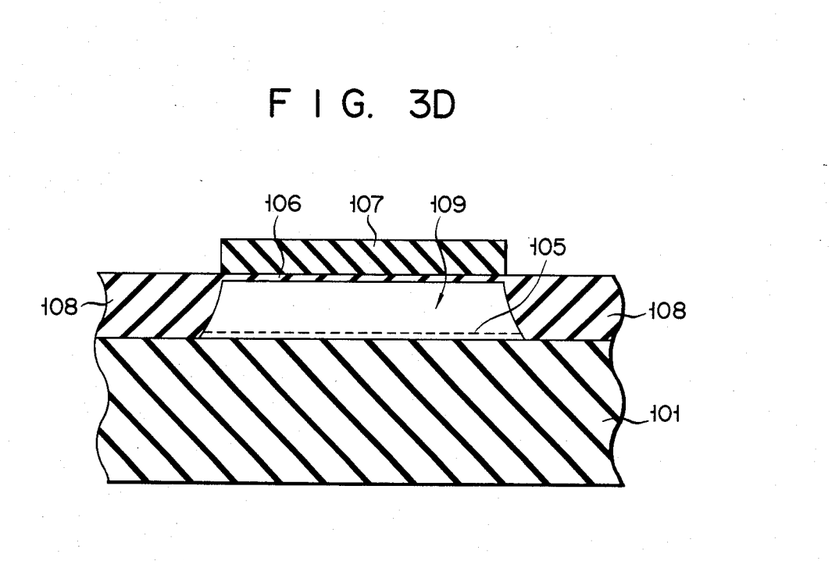

Subsequently, the resultant structure was thermally oxidized in a gas mixture of $H_2$ and $O_2$ at a temperature of 950° C. for 6 hours. In this case, as shown in FIG. 3D, a field oxide film (element isolation region) 108 was formed, embedded in the silicon layer 102, and having substantially the same level as that of the silicon layer 102. At the same time, an island silicon layer 109 (element region), isolated by the field oxide film 108, was formed.

Figure 3E:
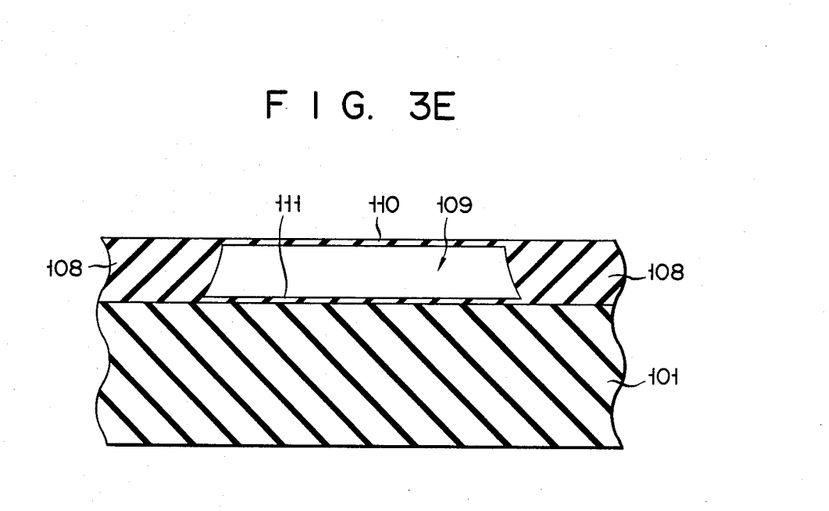

As shown in FIG. 3E, after the $Si_3N_4$ pattern 107 and the $SiO_2$ pattern 106 were removed, the resultant structure was thermally oxidized at a temperature of 950° C. for one hour, so that a gate oxide film 110 was grown on the surface of the island silicon layer 109 to a thickness of 450 Å. In accordance with the two thermal oxidation processes for forming the gate oxide film 110 and the field oxide film 108, the impurity ion injection layer 105 formed in the portion of the island silicon layer 109 was activated, so that the impurity was diffused to form an insulation layer 111 at the interface between the substrate 101 and the island silicon layer 109. More specifically, when the structure was annealed at a temperature of 950° C., oxygen reacts with the ion-implanted silicon, the silicon layer and aluminum from the sapphire substrate 101, so that silicon oxide ($SiO_2$) and aluminum oxide ($Al_2O_3$) produce daltonides such as $SiO_2$-$2Al_2O_3$ and $SiO_2$-$Al_2O_3$ and a bertholide such as $Si_xAl_yO_z$ (where x, y and z are positive integers). It is assumed that these compounds were inserted in a region of the island silicon layer 109 which became amorphous because of the ion implantation of silicon and oxygen. Once the insulation layer 111 has been formed, the silicon region, which was close to the interface and poor in crystallinity, was removed. As a result, the crystallinity of that portion of the island silicon layer 109 which was near the interface was improved.

Figure 3F:
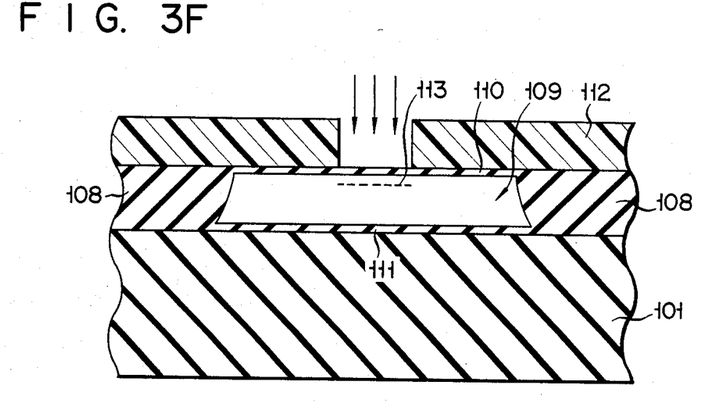
Figure 3G:
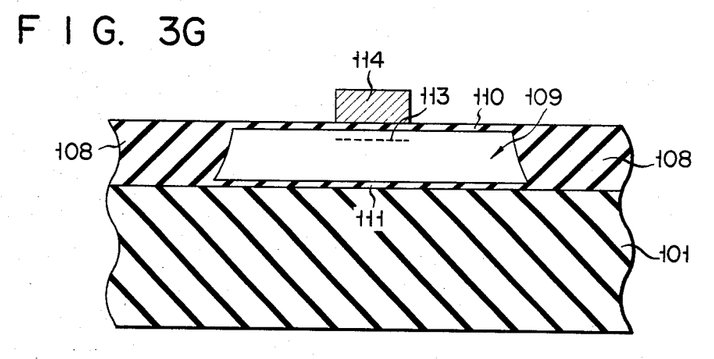

As shown in FIG. 3F, a resist pattern 112, having an opening corresponding to the prospective channel region, was formed by PEP, and then a p-type impurity, e.g., boron, was ion-implanted in the island silicon layer 109 through the gate oxide film 110 at an acceleration energy of 160 keV and a dose of $3 \times 10^{12}$ cm$^{-2}$ using the resist pattern 112 as a mask, thereby forming a boron ion injection layer 113. Subsequently, as shown in FIG. 3G, after the resist pattern 112 was removed, a phosphorus-doped polysilicon film was deposited to a thickness of 4500 Å by the CVD method to cover the entire surface and was patterned to form a gate electrode 114.

Figure 3H:
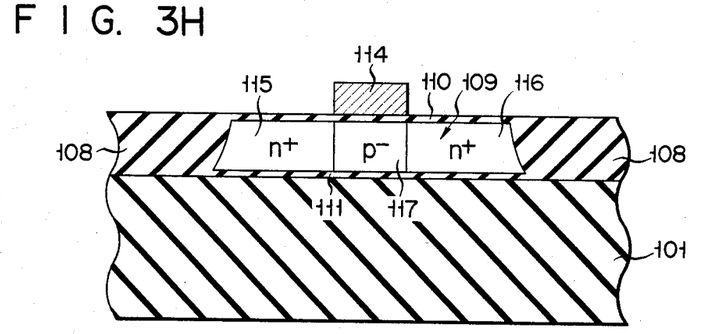

As shown in FIG. 3H, an n-type impurity, e.g., arsenic, was ion-implanted in the island silicon layer 109 through the gate oxide film 110 at an acceleration energy of 40 keV and a dose of $2 \times 10^{15}$ cm$^{-2}$ using as masks the field oxide film 103 and the gate electrode 114. The resultant structure was annealed to form n+-type source and drain regions 115 and 116 in the island silicon layer 109 such that the bottoms of the regions 115 and 116 reached the surface of the insulation layer 111. In this case, the boron ion injection layer 113 was activated to form a p−-type channel region 117 in the island silicon layer 109 between the source and drain regions 115 and 116.

Figure 3I:
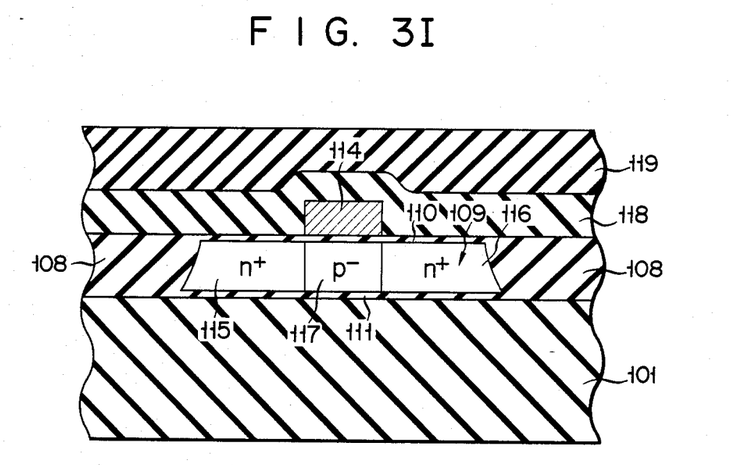
Figure 3J:
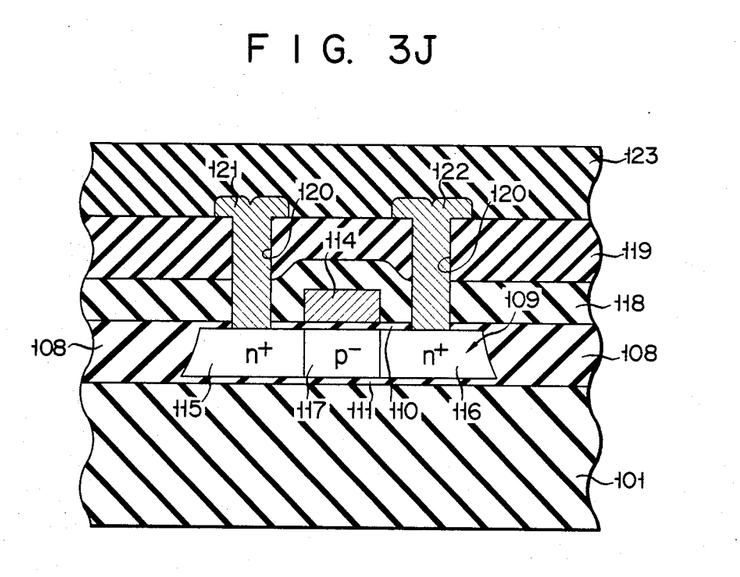

As shown in FIG. 3I, an $SiO_2$ film 118 and a BPSG film 119 were sequentially formed by the CVD method to a thicknesses of 3,000 Å and 5,000 Å, respectively, to cover the entire surface. As shown in FIG. 3J, the BPSG film 119, the $SiO_2$ film 118, and the gate oxide film 110 were selectively etched by using a resist film (not shown) as a mask, thereby forming contact holes 120. This resist film was then removed, and aluminum was deposited to cover the entire surface. The aluminum film was patterned to form aluminum wiring strips 121 and 122, which were respectively connected to the source and drain regions 115 and 116 through the corresponding contact holes 120. A PSG film 123 was deposited by the CVD method to cover the entire surface to a thickness of 1.2 μm, thereby preparing the n-channel MOS transistor.

Figure 4:
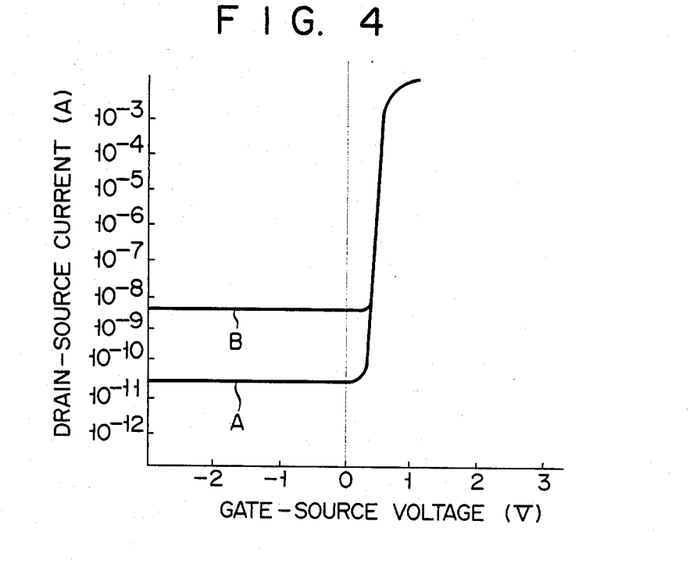
FIG. 4 is a graph showing $V_{GS}$-$I_{DS}$ characteristic curves of n-channel MOS transistors manufactured by the conventional method, shown in FIGS. 1A to 1H, and by the method of the present invention.

According to the present invention, silicon and oxygen are ion-implanted in that portion of the silicon layer 102 which is close to the interface between the substrate 101 and the silicon layer 102. Thereafter, annealing (i.e., thermal oxidation) is performed, thus forming a field oxide film and a gate film. At the same time, an insulation layer 111 is formed in that portion of the island silicon layer 109 which is near the interface. This layer 111 improves the crystal structure in the island silicon layer 109 which is located near the interface. The layer 111 also improves the physical state in the vicinity of the interface. Therefore, a leak in the current can be substantially decreased, whereby a highly reliable MOS transistor is provided. In fact, a voltage ($V_{GS}$) applied to the gate electrode 114 of the n-channel MOS transistor (channel length of 2 μm and channel width of 100 μm) changes while a voltage +5 V is applied to the drain region 116 thereof. Results are shown in the $V_{GS}$-$I_{DS}$ characteristic curve of FIG. 4. It should be noted that a curve A is the characteristic curve of the MOS transistor manufactured by the method of the present invention, and that a curve B is the characteristic curve of the MOS transistor (channel length of 2 μm and channel width of 100 μm) manufactured by the conventional method shown in FIGS. 1A to 1H. As is apparent from FIG. 4, the drain current ($I_{DS}$) of the MOS transistor manufactured by the method of the present invention is decreased to one-hundredth of the MOS transistor (FIG. 1H) manufactured by the conventional method, thereby greatly decreasing the drain leakage current.

Figure 5:
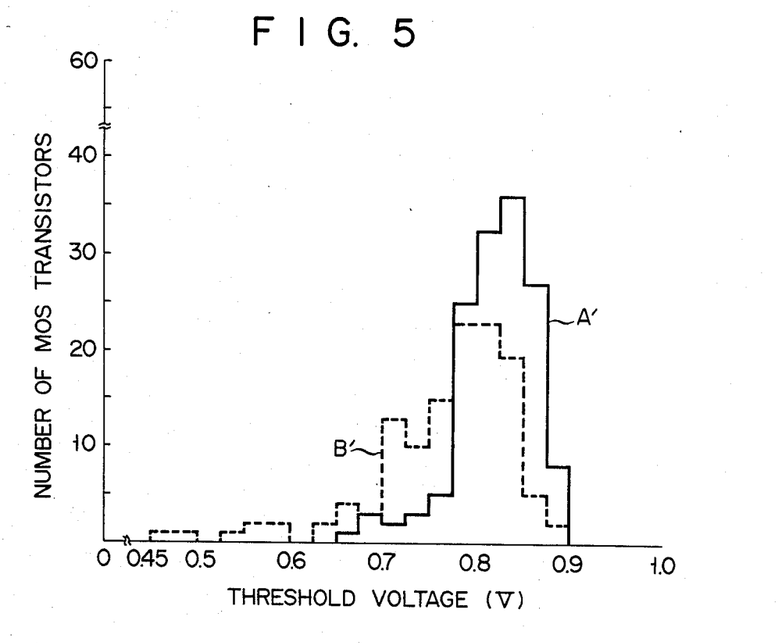
FIG. 5 is a graph showing frequency distributions of the threshold voltage of n-channel MOS transistors manufactured by the conventional method, shown in FIGS. 1A to 1H, and by the method of the present invention.

A surface state indeed occurs between the sapphire substrate 101 and island silicon layer 109 and may vary. However, since it is small, its variation does not lead to an alarming variation of the threshold voltage. Therefore, the yield of the MOS transistors is increased. Variations in threshold voltages were measured for 130 MOS transistors manufactured by the example of the present invention and 130 MOS transistors manufactured by the conventional method shown in FIGS. 1A to 1H. The frequency distribution graph obtained is shown in FIG. 5. It was found that an average value of the threshold voltages (indicated by an area A') of the MOS transistors manufactured by the example of the present invention was about +0.83 V, and the threshold voltages varied with a small deviation of 0.03 V. However, it was found that an average value of the threshold voltages (indicated by an area B') of the MOS transistors manufactured by the conventional method was about +0.69 V, and the threshold voltages varied with a considerably large deviation of 0.08 V.

When the insulation layer 111 is formed at the interface between the sapphire substrate 101 and the island silicon layer 109, aluminum, which is automatically doped from the sapphire substrate 101, is injected in the insulation layer 111, thereby preventing diffusion of aluminum in the island silicon layer 109. Carrier mobility can be improved to obtain a high-speed MOS transistor.

In the above example, at the time of ion implantation of silicon and oxygen, silicon is ion-implanted first. However, oxygen may be ion-implanted first.

In the above example, silicon and oxygen are respectively ion-implanted at an acceleration energy of 160 keV and a dose of $2 \times 10^{15}$ cm$^{-2}$. However, the ion implantation conditions such as the acceleration energy and the dose can be varied such that an impurity concentration at the interface between the sapphire substrate and the monocrystalline silicon layer falls within the range between $10^{17}$ cm$^{-3}$ and $10^{22}$ cm$^{-3}$.

In the above example, annealing for forming the insulation layer is performed by the thermal oxidation for forming the field oxide film and the gate oxide film. However, this annealing can be separately performed.

The present invention is not limited to the manufacture of an n-channel MOS transistor. The present invention can also be applied to the manufacture of a p-channel MOS transistor and a CMOS (complementary metal oxide semiconductor).

According to the present invention as described above, there is provided a method for manufacturing a highly reliable, high-speed semiconductor device with a high yield wherein leakage in the current is decreased, variations in threshold voltage are decreased, and carrier mobility can be improved.

What is claimed is:

1. A method of fabricating a MOS device on a SOS wafer by stabilizing an interface region with a silicon and oxygen implant, comprising the steps of:

forming a monocrystalline silicon layer on a sapphire substrate;

ion-implanting silicon and oxygen in a portion of said silicon layer, which is located in the vicinity of said interface between said sapphire substrate and said silicon layer;

annealing the resultant structure to improve a crystal structure of said portion of said silicon layer in the vicinity of said interface, and forming an insulation layer at said interface;

selectively forming an element isolation region in said silicon layer to obtain an island silicon layer;

forming a gate insulation film on said island silicon layer;

forming a gate electrode on said gate insulation film;

ion-implanting an impurity in said island silicon layer by using said gate electrode as a mask; and annealing the resultant structure to form source and drain regions in said island silicon layer such that bottoms thereof reach a surface of said insulation layer.

* * * * *